United States Patent
Zushi et al.

(10) Patent No.: US 7,345,383 B2
(45) Date of Patent: Mar. 18, 2008

(54) ABNORMALITY DETECTION APPARATUS FOR A POWER FEED CIRCUIT

(75) Inventors: Yuji Zushi, Tokyo (JP); Shozo Kanazki, Tokyo (JP)

(73) Assignee: Mitsubushi Denki Kabushiki Kaisha, Tokyo (JP)

( * ) Notice: Subject to any disclaimer, the term of this patent is extended or adjusted under 35 U.S.C. 154(b) by 134 days.

(21) Appl. No.: 11/379,591

(22) Filed: Apr. 21, 2006

(65) Prior Publication Data

US 2007/0103006 A1    May 10, 2007

(30) Foreign Application Priority Data

Nov. 9, 2005   (JP) ............................. 2005-325143

(51) Int. Cl.
H01H 35/00  (2006.01)
H01H 47/00  (2006.01)
H01H 83/00  (2006.01)
H02B 1/24   (2006.01)
H02H 3/00   (2006.01)

(52) U.S. Cl. ..................... 307/130; 361/100
(58) Field of Classification Search ............. 307/130, 307/131, 117; 361/24, 103, 78, 93.1, 100, 361/115

See application file for complete search history.

(56) References Cited

U.S. PATENT DOCUMENTS 5,444,595 A * 8/1995 Ishikawa et al. .............. 361/86

FOREIGN PATENT DOCUMENTS

JP       08293414 A     11/1996
JP     2000312142 A     11/2000

* cited by examiner

*Primary Examiner*—Michael Sherry
*Assistant Examiner*—Carlos Amaya
(74) *Attorney, Agent, or Firm*—Sughrue Mion, PLLC

(57) ABSTRACT

A single state detector circuit can quickly detect short-circuit and open-circuit abnormalities of a load controlled by a power transistor. A DC power supply, the load and the power transistor are serially connected with one another, so that a switching terminal voltage of the power transistor is binarized into high and low levels by the state detector. The power transistor is linearly controlled by a constant-current control circuit so as to suppress an excessive current, and power supplied to the power transistor is interrupted by an overheat interruption circuit. Upon occurrence of a short-circuit in the load during generation of an energization command, a switching terminal voltage of the power transistor becomes stabilized at a high level without intermittent operation, which is detected by the state detector. Upon occurrence of an open-circuit during generation of a deenergization command, a low switching terminal voltage is detected by the state detector.

11 Claims, 7 Drawing Sheets

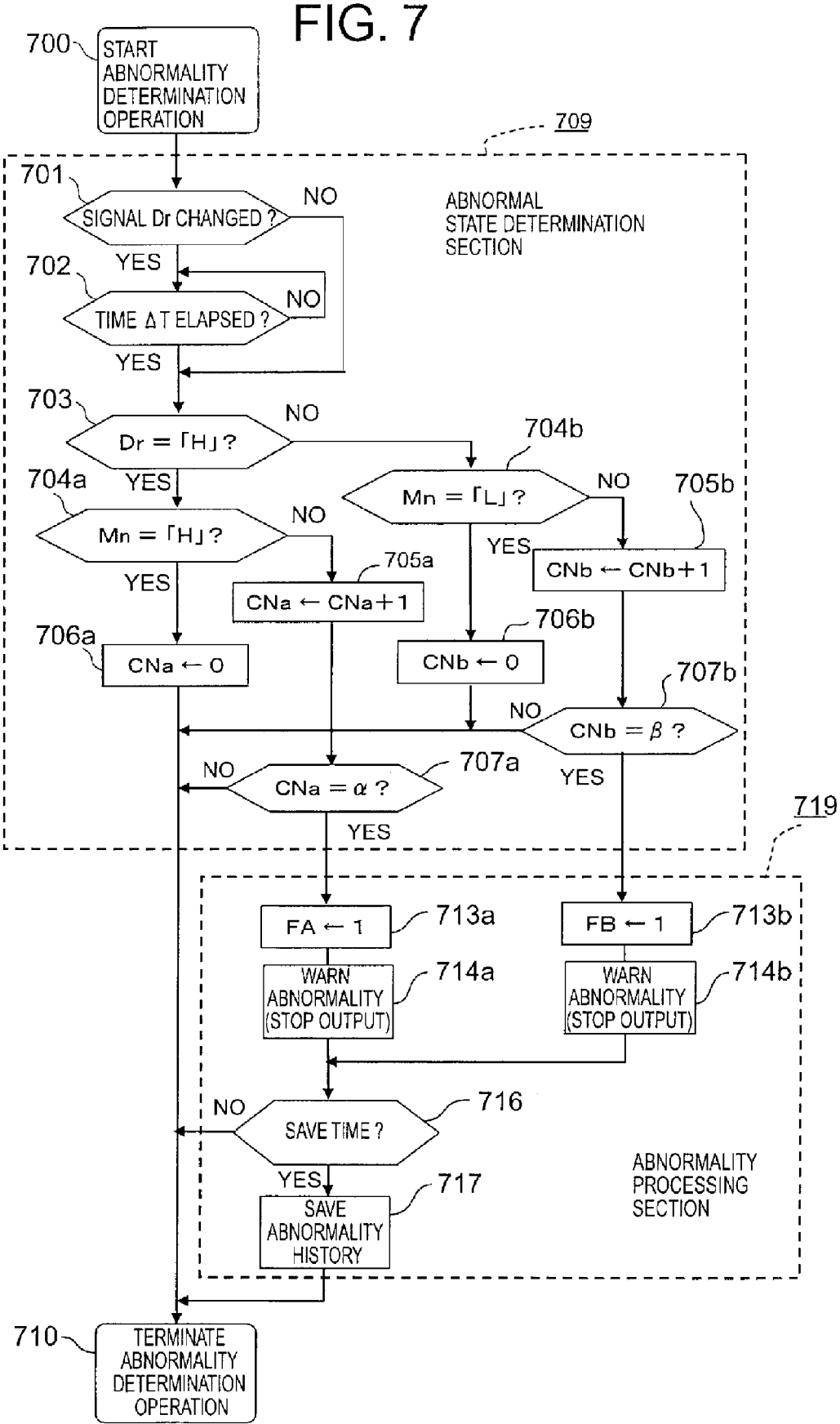

ABNORMALITY DETECTION APPARATUS FOR A POWER FEED CIRCUIT

BACKGROUND OF THE INVENTION

1. Field of the Invention

The present invention relates to an abnormality detection apparatus for a power feed circuit that is built in a vehicle-mounted electronic control apparatus (an engine control apparatus, a transmission control apparatus, etc.), and more particularly, it relates to such an abnormality detection apparatus for a power feed circuit in which a power transistor for controlling the supply of power to an electric load has an overcurrent limiting function and an overheat interruption function, and which can identify and determine the presence or absence of an open-circuit abnormality and a short-circuit abnormality of the electric load in a quick manner.

2. Description of the Related Art

In general, in power feed control on an electric load, there have been widely put into practical use intelligent power switching devices having a power transistor, an overcurrent limiting function and an overheat interruption function.

Specifically, there has been proposed an apparatus which can limit an overcurrent through switching (on/off) control of a main transistor by the use of a current detection resistor arranged in a current mirror circuit, and detect an overheat of the main transistor by using a temperature detection element, so that the current supplied to the electric load is interrupted by an N-MOS type field-effect transistor (see, for example, a first patent document: Japanese patent application laid-open No. 2000-312142 (FIG. 1 and Abstract)).

Also, as an abnormality detection apparatus for a power feed circuit (a failure detection apparatus for a solenoid) which performs power feed control on a solenoid (electric load) by means of a transistor, there has been proposed an apparatus which can identify and determine the presence or absence of an open-circuit or break abnormality and a short-circuit abnormality by making a comparison between a switching control command for a transistor and a power feed voltage level for the electric load (see, for example, a second patent document: Japanese patent application laid-open No. H8-293414 (FIG. 2 and Paragraph Nos. 0024 through 0028)).

According to the conventional abnormality detection apparatus for a power feed circuit, for example, in the case of the intelligent power switching device as described in the above-mentioned first patent document, the energization of an overheat self-hold type semiconductor switch (power transistor) connected to a downstream side of the electric load is interrupted upon occurrence of an overcurrent, but no particular reference is made to how to handle an open-circuit abnormality or a short-circuit abnormality of the power feed circuit, and an open-circuit state and a short-circuit state of the electric load cannot be detected in a quick manner, thus posing a problem that the power transistor is not able to be protected to a satisfactory extent.

In addition, in the case of the failure detection apparatus for a solenoid described in the above-mentioned second patent document, a determination as to whether the solenoid is in an open-circuit abnormality or in a short-circuit abnormality is made, irrespective of the operating state of the solenoid, by artificially energizing the solenoid in a short time during an inoperative period thereof or artificially interrupting the energization of the solenoid in a short time during an operating period thereof, but no particular reference is made to how to handle an overcurrent limiting characteristic and a transition characteristic of an abnormal state detection signal, and hence it is impossible to detect an open-circuit state and a short-circuit state of the electric load in a quick manner, as in the case of the first patent document. Thus, in this case, too, there is a problem that the power transistor is not able to be protected to a satisfactory extent.

SUMMARY OF THE INVENTION

Accordingly, the present invention is intended to obviate the problems as referred to above, and has for its object to provide an abnormality detection apparatus for a power feed circuit which is capable of detecting an open-circuit state and a short-circuit state of an electric load in a quick manner by using a single state detection circuit, and alleviating an overcurrent stress of a power transistor that drives the electric load, thereby preventing burnout of the power transistor.

Bearing the above object in mind, according to the present invention, there is provided an abnormality detection apparatus for a power feed circuit in which a DC power supply, an electric load, and a power transistor, which is controlled to open and close by a switching control section, are connected in series with one another through a wiring circuit. A constant current control circuit, an overheat interruption circuit and a state detection circuit are connected to the power transistor for cooperation therewith. The switching control section includes an abnormal state determination section and an abnormality processing section. The constant current control circuit is composed of a negative feedback control circuit. The constant current control circuit includes a conduction control transistor that operates in response to a detected voltage of a current detection resistor. The constant current control circuit linearly controls the conductive state of the power transistor in such a manner that a current flowing through the power transistor does not become a value equal to or larger than the value of a limit threshold current which is larger than a predetermined reference current corresponding to a rated current of the it power transistor, and maintains, upon occurrence of a short-circuit abnormality of the electric load, a voltage across opposite ends of the power transistor at a value equal to or higher than a predetermined logical determination voltage. The overheat interruption circuit is composed of a comparison control circuit. The comparison control circuit includes a temperature detection element for detecting a temperature in the vicinity of the power transistor, and an interruption control transistor, and operates to interrupt the power transistor when the temperature in the vicinity of the power transistor exceeds a predetermined temperature. The state detection circuit includes a state detection transistor and an open-circuit detection resistor connected in parallel to the power transistor. The state detection transistor is operated to open and close in accordance with whether the voltage across the opposite ends of the power transistor becomes equal to or higher than the logical determination voltage. An output signal of the state detection transistor is input to the switching control section as a state detection signal. The abnormal state determination section comprises a logical determination section. When a control output signal from the switching control section is a close command for the power transistor, and when the voltage across the opposite ends of the power transistor continues to be equal to or higher than the logical determination voltage, the logical determination section generates a short-circuit abnormality determination signal indicating that a short-circuit abnormality has occurred in the electric load. When the control output signal is an open command for the power transistor, and when the voltage across the opposite ends of the power transistor continues to be lower than the logical determination voltage, the logical determination section generates an open-circuit abnormality determination signal indicating that an open-circuit abnormality has occurred in the electric load. The abnormality processing section performs at least one of abnormality warning processing and stop processing of the control output signal in response to the short-circuit abnormality determination signal or the open-circuit abnormality determination signal.

According to the present invention, a determination as to whether the electric load is in a open-circuit abnormal state, in a short-circuit abnormal state or in a normal state can be made in accordance with the combination of the logic level of the control output signal for the power transistor and the logic level of the state detection signal for the voltage across the opposite ends of the power transistor.

In addition, when a short-circuit abnormality of the electric load occurs, the state detection circuit is made to operate in a stable manner by stabilizing the voltage across the opposite ends of the power transistor at a value equal to or higher than a predetermined logical determination voltage without causing the power transistor to operate in an intermittent manner, so it is possible to quickly determine the presence or absence of an abnormality.

Further, the current flowing through the power transistor is linearly controlled so as to be equal to or lower than the limit threshold current, so when a short-circuit abnormality of the electric load occurs, an overcurrent stress given to the power transistor is reduced, and at the same time, a power loss generated in the power transistor becomes large in comparison with the case where the power transistor is switched or turned on and off, as a result of which, the overheat interruption circuit is quickly operated to prevent burnout of the power transistor.

The above and other objects, features and advantages of the present invention will become more readily apparent to those skilled in the art from the following detailed description of preferred embodiments of the present invention taken in conjunction with the accompanying drawings.

BRIEF DESCRIPTION OF THE DRAWINGS

FIG. 7 is a flow chart illustrating an abnormality determination operation of the abnormality detection apparatus for a power feed circuit according to the second embodiment of the present invention.

DESCRIPTION OF THE PREFERRED EMBODIMENTS

Hereinafter, preferred embodiments of the present invention will be described in detail while referring to the accompanying drawings.

Embodiment 1

Figure 1:
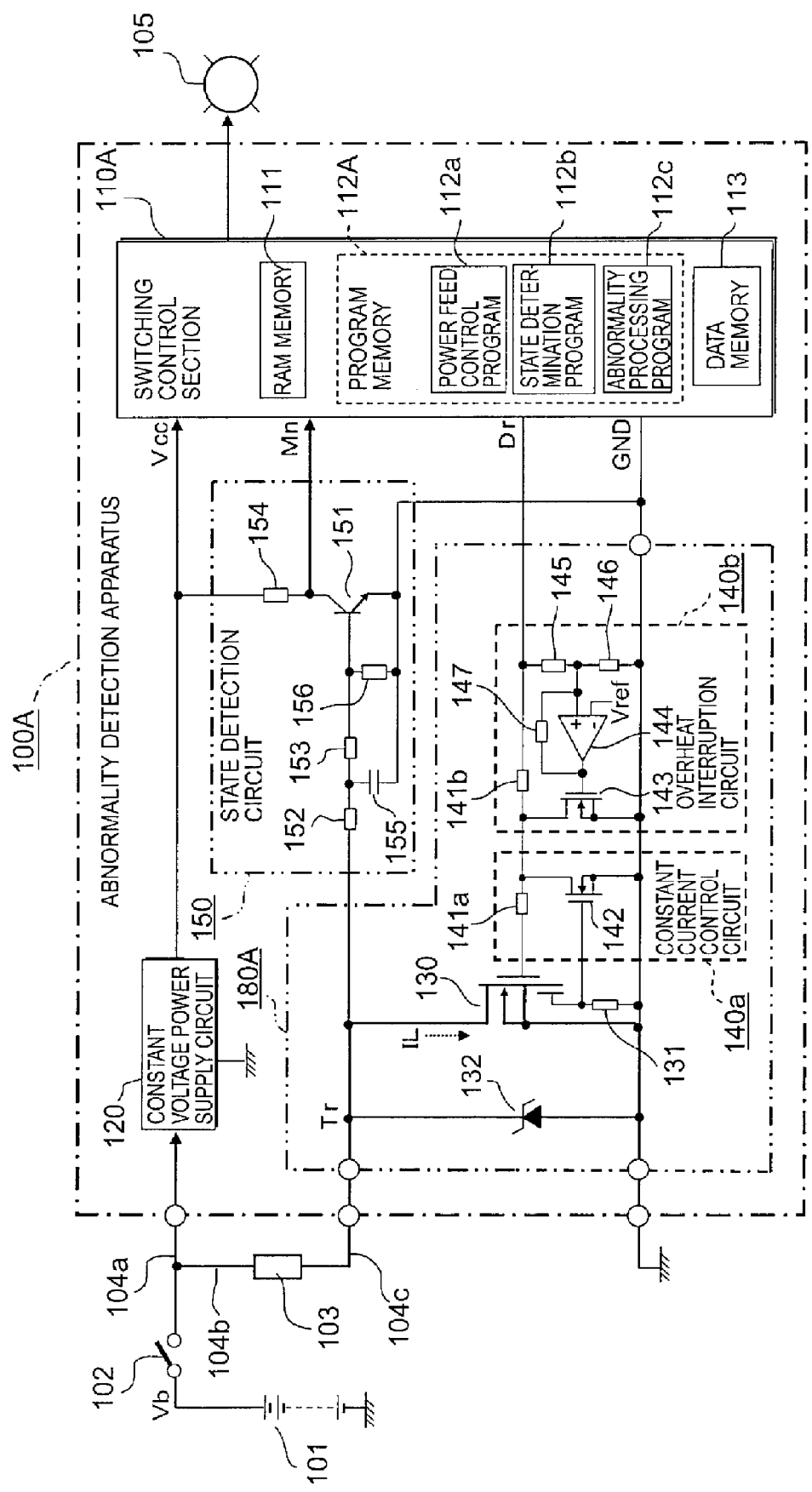
FIG. 1 is a circuit block diagram showing the overall configuration of an abnormality detection apparatus for a power feed circuit according to a first embodiment of the present invention.

First, reference will be made to an abnormality detection apparatus for a power feed circuit according to a first embodiment of the present invention. FIG. 1 is a circuit block diagram that shows the overall configuration of the abnormality detection apparatus for a power feed circuit according to the first embodiment of the present invention.

In FIG. 1, the abnormality detection apparatus, generally designated at 100A, constitutes, in a concrete sense, an automotive engine control apparatus, and is fed power from a DC power supply 101 in the form of an on-board battery through a power switch 102 such as a key switch, etc., and a power supply line 104a.

In addition, an electric load 103 is composed, for example, of an electromagnetic coil for driving an electromagnetic valve for emission control in an automotive engine control unit, and is connected to the abnormality detection apparatus 100A. The electric load 103 is connected to the power supply line 104a through the wiring circuit 104b comprising a positive terminal lead wire, and is also connected to a drain terminal of a power transistor 130 (to be described later) through a wiring circuit 104c comprising a negative terminal lead wire.

The DC power supply 101 and the electric load 103 are connected in series with each other through the wiring circuits 104b, 104c, and at the same time are connected to the power transistor 130 that is controlled to be switched on and off by a switching control section 110A to be described later, thus constituting a power feed circuit.

A warning indicator 105 is connected to an output terminal of the switching control section 110A, and is installed on a vehicle at a location outside of the abnormality detection apparatus 100A in such a manner that it is able to be visually checked or inspected by the driver of the vehicle in an easy way.

Here, note that a multitude of electric loads and a variety of kinds of input sensors (not illustrated) are connected to the abnormality detection apparatus 100A, so that the abnormality detection apparatus 100A performs power feed processing or power feed stop processing for the electric load 103 in response to the operating state of the various input sensors.

The abnormality detection apparatus 100A includes the switching control section 110A that constitutes a major component part, a constant voltage power supply circuit 120 that generates a stable control power supply voltage Vcc, a state detection circuit 150 that generates a state detection signal Mn based on a voltage across the opposite ends of the power transistor 130, and a power module 180A driven by a control output signal Dr from the switching control section 110A.

The power module 180A is integrally formed of the power transistor 130, a current detection resistor 131, an overvoltage suppression diode 132, a constant current control circuit 140*a*, and an overheat interruption circuit 140*b*. The constant current control circuit 140*a* includes a first drive resistor 141 *a* and a conduction control transistor 142 in the form of an N-MOS field effect transistor. The overheat interruption circuit 140*b* includes a second drive resistor 141 b, an interruption control transistor 143 in the form of an N-MOS field effect transistor, a comparison amplifier 144, a temperature detection element 145, a voltage dividing resistor 146, and a positive feedback resistor 147. The state detection circuit 150 includes a state detection transistor 151 in the form of an NPN-type transistor, drive resistors 152, 153 (open-circuit detection resistors), a pull-up resistor 154, a smoothing capacitor 155, and a stabilization resistor 156.

The switching control section 110A is constituted by a microprocessor (CPU), and includes a RAM memory 111 for calculation processing, a program memory 112A (e.g., a nonvolatile flash memory), and a data memory 113 (e.g., a nonvolatile EEPROM). The program memory 112A includes a power feed control program 112*a*, a state determination program 112*b*, and an abnormality processing program 112*c*. The power feed control program 112*a* constitutes a power feed control section, and generates a control output signal Dr to the power transistor 130. The state determination program 112*b* constitutes an abnormal state determination section, and identifies and determines the presence or absence of a open-circuit abnormality and a short-circuit abnormality of the electric load 103 in response to the logic level of the state detection signal Mn and the logic level of the control output signal Dr. The abnormality processing program 112*c* constitutes an abnormality processing section, and performs abnormality warning processing or stop processing of the control output signal Dr in response to the abnormality determination result of the state determination program 112*b* (abnormal state determination section). The nonvolatile data memory 113 constitutes a historical information save and storage section, and stores, as historical information of an abnormality occurrence state of the electric load 103, information on the presence or absence of an open-circuit abnormality or the presence or absence of a short-circuit abnormality.

The constant voltage power supply circuit 120 functions as a control power supply for the switching control section 110A, and generates a stabilized control power supply voltage Vcc (e.g., DC 5 [V]) based on a power supply voltage Vb that is fed from the DC power supply 101 through the power switch 102, and supplies it to the switching control section 110A.

The power transistor 130 is composed of an N-MOS field effect transistor, and is connected to a downstream side of the electric load 103. The current detection resistor 131, together with a source terminal of the power transistor 130, is grounded to the body of the vehicle, which is at a ground potential GND, so as to be connected to a negative terminal of the DC power supply 101. The overvoltage suppression diode 132 is composed of a voltage regulation or Zener diode, and is connected between the drain and source terminals (or between the drain and gate terminals) of the power transistor 130. A load current IL flowing through the power transistor 130 during closure (turn-on) thereof attenuates rapidly through the overvoltage suppression diode 132 when the power transistor 130 is opened (turned off). As a result, a surge voltage generated upon opening of the power transistor 130 is restricted in accordance with the constant voltage characteristic of the overvoltage suppression diode 132.

In the constant current control circuit 140*a*, the conduction control transistor 142 has a drain terminal connected to a junction between the first and second drive resistors 141*a*, 141*b*, and the conduction control transistor 142 has a source terminal grounded to the vehicle body, and a gate terminal connected to the current detection resistor 131. The first and second drive resistors 141*a*, 141*b* are connected in series with each other, and inserted between the gate terminal of the power transistor 130 and the output terminal (control output terminal) of the switching control section 110A that generates the control output signal Dr.

The constant current control circuit 140*a* cooperates with the conduction control transistor 142, which operate in response to a detected voltage of the current detection resistor 131, to constitute a negative feedback control circuit, and linearly controls the conductive state of the power transistor 130 in such a manner that the load current IL flowing through the power transistor 130 does not exceed the value of a limit threshold current Ic. As a result, upon occurrence of a short-circuit abnormality or malfunction of the electric load 103, the voltage across the opposite ends of the power transistor 130 is maintained at a value equal to or higher than a predetermined logical determination voltage. Here, note that the limit threshold current Ic is a current value larger than a predetermined reference current Ir corresponding to a rated current of the power transistor 130.

The current detection resistor 131 is connected in series to a current mirror circuit through which a fine current proportional to a drain current of the power transistor 130 flows. The current mirror circuit is formed at one end of the current detection resistor 131 related to the power transistor 130, so that a part (e.g., ¹⁄₁,₀₀₀) of the drain current passing through the power transistor 130 will flow into the resistor 131. As a result, when the reference current Ir flows through the power transistor 130, the current detection resistor 131 generates a first detected voltage V1 that is represented by the following expression (1).

$$V1 = Rr \times Ir/n \quad (1)$$

where Rr is the resistance value of the current detection resistor 131, and n is a current mirror ratio. In addition, the first detected voltage V1 is set to a value equal to or lower than a gate-off voltage Voff (e.g., DC 2 [V]) of the conduction control transistor 142.

On the other hand, when the limit threshold current Ic flows through the power transistor 130, the current detection resistor 131 generates a second detected voltage V2 that is represented by the following expression (2).

$$V2 = Rr \times Ic/n \quad (2)$$

where the second detected voltage V2 is set to a value equal to or higher than a gate-on voltage Von (e.g., DC 4 [V]) of the conduction control transistor 142.

In the overheat interruption circuit 140*b*, the interruption control transistor 143 has a drain terminal connected to a junction between the first and second drive resistors 141*a*, 141*b*, as in the case of the conduction control transistor 14, and the interruption control transistor 143 has a source terminal grounded to the vehicle body, and a gate terminal connected to an output terminal of the comparison amplifier 144.

The temperature detection element 145 and the voltage dividing resistor 146 are connected in series with each other, and inserted between the control output terminal of the switching control section 110A and a vehicle body grounded circuit of a ground potential GND.

The comparison amplifier 144 has a non-inverting input terminal (+) connected to a junction between the temperature detection element 145 and the voltage dividing resistor 146, and at the same time connected to the output terminal of the comparison amplifier 144 through the positive feedback resistor 147, and it also has an inverting input terminal (−) applied with a reference voltage Vref corresponding to the predetermined temperature.

The temperature detection element 145 detects the temperature in the vicinity of the power transistor 130, and serves to raise the potential of the junction thereof with the voltage dividing resistor 146 in accordance with the rising temperature. When the potential of the non-inverting input terminal (+) of the comparison amplifier 144, rising in accordance with the rising temperature, exceeds the reference voltage Vref applied to the inverting input terminal (−) thereof (i.e., when the temperature in the vicinity of the power transistor 130 exceeds a predetermined temperature), the output logic of the comparison amplifier 144 becomes an "H (high)" level, as a result of which the interruption control transistor 143 is closed (turned on), and the power transistor 130 is opened (turned off). In addition, when the output logic of the comparison amplifier 144 becomes a high level, the voltage of the non-inverting input terminal (+) rises through the positive feedback resistor 147, so the output logic of the comparison amplifier 144 is maintained at a high level.

In the state detection circuit 150, the state detection transistor 151 has an emitter terminal grounded to the vehicle body, and a base terminal connected to the drain terminal of the power transistor 130 through the drive resistors 152, 153. Also, the state detection transistor 151 has a collector terminal connected to the output terminal of the constant voltage power supply circuit 120 through the pull-up resistor 154, and at the same time connected to the input terminal of the switching control section 110A to which the state detection signal Mn is input.

The stabilization resistor 156 is inserted between the base and emitter terminals of the state detection transistor 151 so as to open or turn on the state detection transistor 151 in a stable manner. The smoothing capacitor 155 constitutes a noise filter circuit, and is inserted between a series connection point of the drive resistors 152, 153 and the emitter terminal of the state detection transistor 151.

As shown in FIG. 1, the DC power supply 101, the electric load 103 and the power transistor 130 are connected in series with one another, so that a switching terminal voltage Tr of the power transistor 130 is binarized into an "H" level and an "L" level by means of the state detection circuit 150, and is input to the switching control section 110A. The power transistor 130 is linearly controlled by the constant current control circuit 140a so that an excessive current is suppressed and the energization of the power transistor 130 is interrupted by the overheat interruption circuit 140b.

Accordingly, when a short-circuit abnormality occurs in the electric load 103 during the time an energization command is given to the power transistor 130, the switching terminal voltage Tr of the power transistor 130 becomes stabilized at a high level without being operated in an intermittent (on and off) manner, which is detected by the state detection circuit 150. On the other hand, when an open-circuit abnormality occurs during the generation of a deenergization command, the switching terminal voltage Tr of a low level is detected by the state detection circuit 150. As a result, the short-circuit abnormality and the open-circuit abnormality of the electric load 103, which is controlled to be turned on and off by the power transistor 130, can be detected quickly by using the single state detection circuit 150.

Now, reference will be made to the operation of the abnormality detection apparatus for a power feed circuit according to the first embodiment of the present invention as illustrated in FIG. 1 while referring to timing charts in FIGS. 2 through 4.

Figure 2:
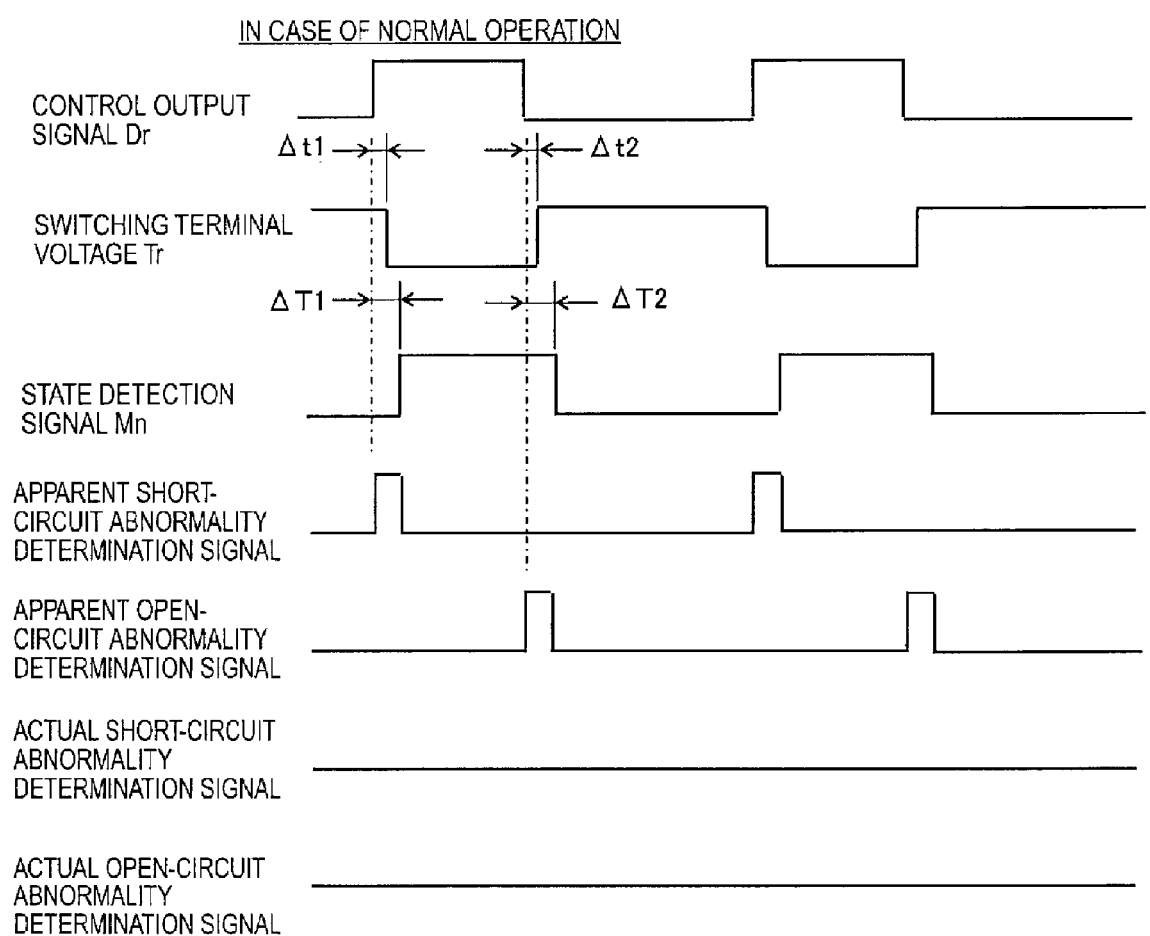
FIG. 2 is a timing chart illustrating an operation characteristic of the abnormality detection apparatus for a power feed circuit at the time of normal operation according to the first embodiment of the present invention.

In FIG. 2, as logic waveforms at the time when the electric load 103 is in a normal state, there are illustrated, in the order from the top to the bottom, the control output signal Dr generated from the switching control section 110A, the switching terminal voltage Tr corresponding to the voltage between the drain and source terminals of the power transistor 130, the state detection signal Mn generated from the state detection circuit 150 including the smoothing capacitor 155 (noise filter), an apparent short-circuit abnormality determination signal (including a transient state), an apparent open-circuit abnormality determination signal (including a transient state), an actual (after determination waiting processing) short-circuit abnormality determination signal (excluding a transient state), and an actual (after determination waiting processing) open-circuit abnormality determination signal (excluding a transient state).

In FIG. 2, the switching terminal voltage Tr of the power transistor 130 falls at a timing delayed by an operation response delay time $\Delta t1$ of the power transistor 130 from the on timing of the control output signal Dr, and rises at a timing delayed by the operation response delay time $\Delta t2$ of the power transistor 130 from the off timing of the control output signal Dr.

Also, the state detection signal Mn generated from the state detection circuit 150 rises after a response time $\Delta T1$ (transition time) including the operation response delay time $\Delta t1$ of the power transistor 130 and a filter time of the smoothing capacitor 155 has elapsed from the on timing of the control output signal Dr, and falls after a response time $\Delta T2$ (transition time) including the operation response delay time $\Delta t2$ of the power transistor 130 and the filter time of the smoothing capacitor 155 has elapsed from the off timing of the control output signal Dr.

The control output signal Dr functions as a close command to close (turn on) the power transistor 130 thereby to supply electric power to the electric load 103 when the logic level is "H (high)", and also functions as an open command to open (turn off) the power transistor 130 thereby to interrupt the supply of electric power to the electric load 103 when the logic level is "L (low)".

When the control output signal Dr is at the "H" logic level (close command), a gate voltage of a sufficiently high level is impressed to the power transistor 130 to close a circuit or path between the drain and source terminals of the power transistor 130, so the switching terminal voltage Tr of the power transistor 130 becomes the "L" logic level.

The load current IL flowing through the electric load 103 upon closure or turn-on of the power transistor 130 is represented by using the power supply voltage Vb of the DC power supply 101 and a load resistance RL of the electric load 103, as shown in the following expression (3).

$$IL \approx Vb/RL \quad (3)$$

Here, note that the value of the load current IL is set to a value equal to or less than the value of the reference current Ir corresponding to the rated current of the power transistor 130.

As a result, the detected voltage of the current detection resistor 131 becomes a value equal to or less than the first detected voltage V1 (=Rr×Ir/n) represented by the above-mentioned expression (1), and the conduction control transistor 142 is completely interrupted or turned off, so it is ensured that the power transistor 130 is in a fully conducting state.

When the control output signal Dr becomes the "L" logic level, the gate voltage of the power transistor 130 becomes zero, and the circuit or path between the drain and source terminals of the power transistor 130 is opened or turned off, whereby the state detection transistor 151 is made conductive through the electric load 103 and the drive resistors 152, 153.

Here, note that a combined series resistance value Rd of the drive resistors 152, 153 is set so as to be sufficiently large in comparison with the load resistance RL of the electric load 103 (Rd >>RL), and hence the electric load 103 is made not to be operated by a minute drive current.

Immediately after the control output signal Dr has changed from the "L" logic level to the "H" logic level or vice versa ("L→H" or "H→L"), the slight operation response delay time $\Delta t1$ or $\Delta t2$ occurs until the power transistor 130 is closed (turned on) or opened (turned off).

Similarly, in the state detection signal Mn comprising the same logic waveform as the control output signal Dr, immediately after the logic level of the control output signal Dr has changed, there arise not only the operation response delay time of the power transistor 130 but also the delay time $\Delta T1$ or $\Delta T2$ which is obtained by adding thereto a response delay time due to the smoothing time constant of the smoothing capacitor (noise filter) 155.

The apparent short-circuit abnormality determination signal (including a transient state) is set to the "H" logic level when the control output signal Dr is at the "H" logic level and in a period in which the state supervision signal Mn is at the "L" logic level (during the response time $\Delta T1$). Here, note that in a predetermined period of time (i.e., a determination waiting time $\Delta T$ to be described later) immediately after the logic level of the control output signal Dr has changed, the actual short-circuit abnormality determination signal is processed to wait in the switching control section 110A so that the abnormality determination operation according to the state determination program 112b (abnormal state determination section) is nullified.

The apparent open-circuit abnormality determination signal (including a transient state) is set to the "H" logic level when the control output signal Dr is at the "L" logic level and in a period in which the state supervision signal Mn is at the "H" logic level (during the response time $\Delta T2$). Here, note that in the predetermined period of time (i.e., the determination waiting time $\Delta T$ to be described later) immediately after the logic level of the control output signal Dr has changed, the actual open-circuit abnormality determination signal is processed to wait in the switching control section 110A so that the abnormality determination operation is nullified.

In FIG. 2, both the actual short-circuit abnormality determination signal and the actual open-circuit abnormality determination signal are at the "L" logic level, and indicate the normal state.

Next, reference will be made to an operation of the abnormality detection apparatus for a power feed circuit in a short-circuit abnormality according to the first embodiment while referring to FIG. 3.

Figure 3:
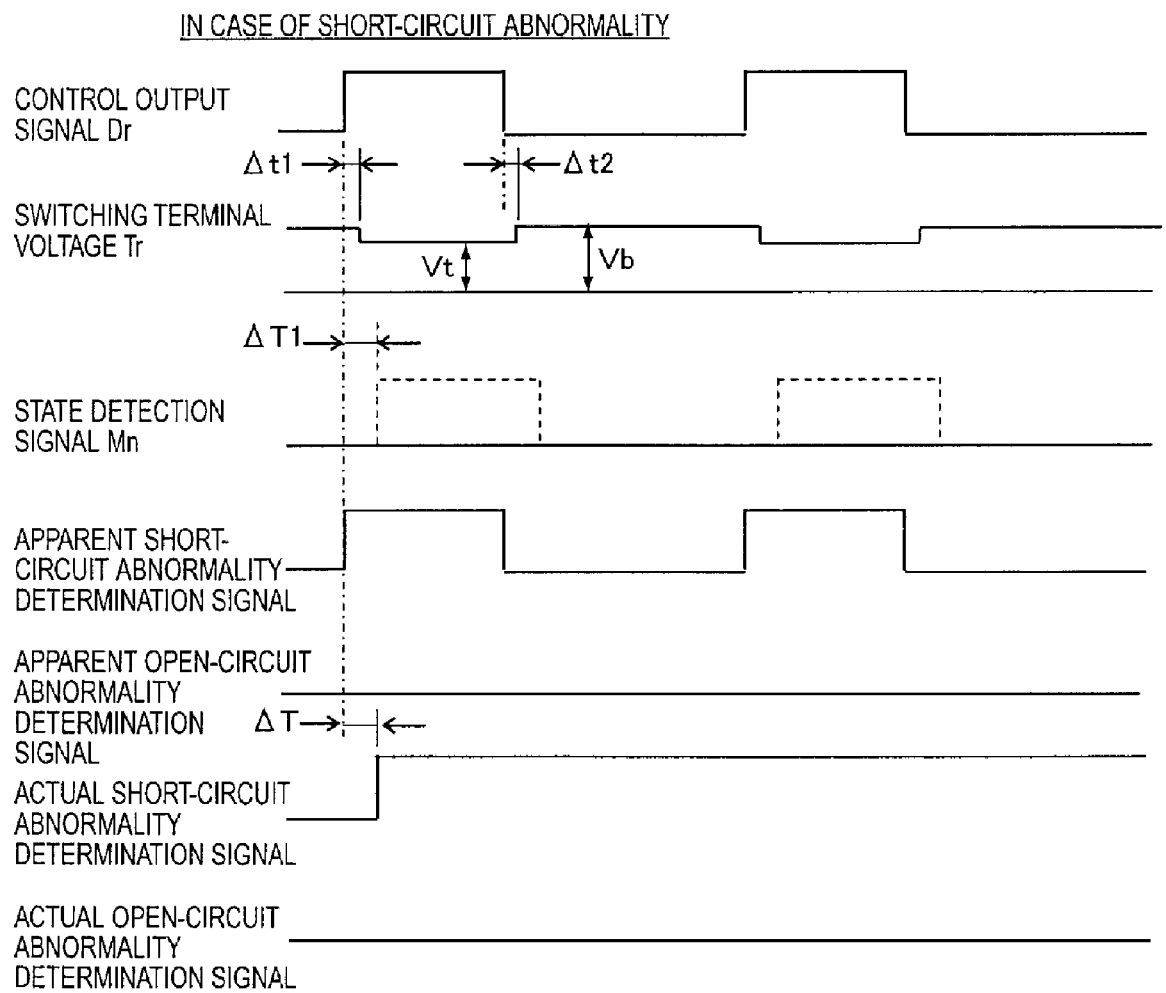
FIG. 3 is a timing chart illustrating an operation characteristic of the abnormality detection apparatus for a power feed circuit at the time of short-circuit abnormality according to the first embodiment of the present invention.

In FIG. 3, similar to FIG. 2, as logic waveforms in the short-circuit abnormality state of the electric load 103, there are illustrated the control output signal Dr, the switching terminal voltage Tr, the state detection signal Mn, the apparent short-circuit abnormality determination signal, the apparent open-circuit abnormality determination signal, the actual short-circuit abnormality determination signal, and the actual open-circuit abnormality determination signal.

Hereinafter, description will be given while focusing on the difference of the operation in FIG. 3 from the normal operation in FIG. 2.

In FIG. 3, the switching terminal voltage Tr changes between the power supply voltage Vb and the control voltage Vt across the drain and the source thereof in a stepwise manner in response to the control output signal Dr. In addition, the actual short-circuit abnormality determination signal rises after the determination waiting time $\Delta T$ has elapsed from the on timing of the control output signal Dr.

In a short-circuit abnormality or malfunction state in which a short-circuit accident occurs in the interior of the electric load 103 or a power supply fault accident in which the wiring circuit 104c is in mixed contact with the power supply line 104a so that the load resistance RL is reduced to a short-circuit resistance R0 ($\approx$0), when the control output signal Dr becomes the "H" logic level, the constant current control circuit 140a performs linear feedback control so that the drain current of the power transistor 130 is controlled to become the limit threshold current Ic.

At this time, the value of the control voltage Vt across the drain and the source of the power transistor 130, corresponding to the switching terminal voltage Tr, is represented as shown by the following expression (4).

$$Vt=Vb-R0\times Ic \quad (4)$$

Accordingly, when the value of the load resistance RL is reduced to the sufficiently small short-circuit resistance R0, the value of the control voltage Vt becomes equal to or higher than a predetermined logical determination voltage, whereby the state detection transistor 151 is closed or turned on. As a result, the state detection transistor 151, which should be originally opened, is put into a closed state, and hence the state detection signal Mn continues to be at the "L" logic level, so the presence or absence of a short-circuit abnormality is determined.

Here, note that when an open-circuit abnormality occurs in the interior of the power transistor 130, the state detection signal Mn does not become the "H" logic level in spite of the control output signal Dr being at the "H" logic level, so it is apparently determined that the electric load 103 is in a short-circuit abnormality.

Moreover, in FIG. 3, upon occurrence of the short-circuit abnormality of the electric load 103, the switching terminal voltage Tr, which should originally become the "L" level, rises up to the control voltage Vt in the closed period of the power transistor 130.

Also, in FIG. 3, when the control output signal Dr is at the "H" logic level, the state detection signal Mn, which should originally become the "H" logic level (see broken lines) after the response time $\Delta T1$ has elapsed, continues to be at the "L" logic level.

Further, in FIG. 3, since the state detection signal Mn is kept at the "L" logic level, the presence or absence of a short-circuit abnormality is determined after the lapse of the determination waiting time $\Delta T$ in spite of the control output signal Dr being at the "H" logic level, so the actual short-circuit abnormality determination signal becomes the "H" logic level.

Next, reference will be made to an operation of the abnormality detection apparatus for a power feed circuit in a open-circuit abnormality according to the first embodiment while referring to FIG. 4.

Figure 4:
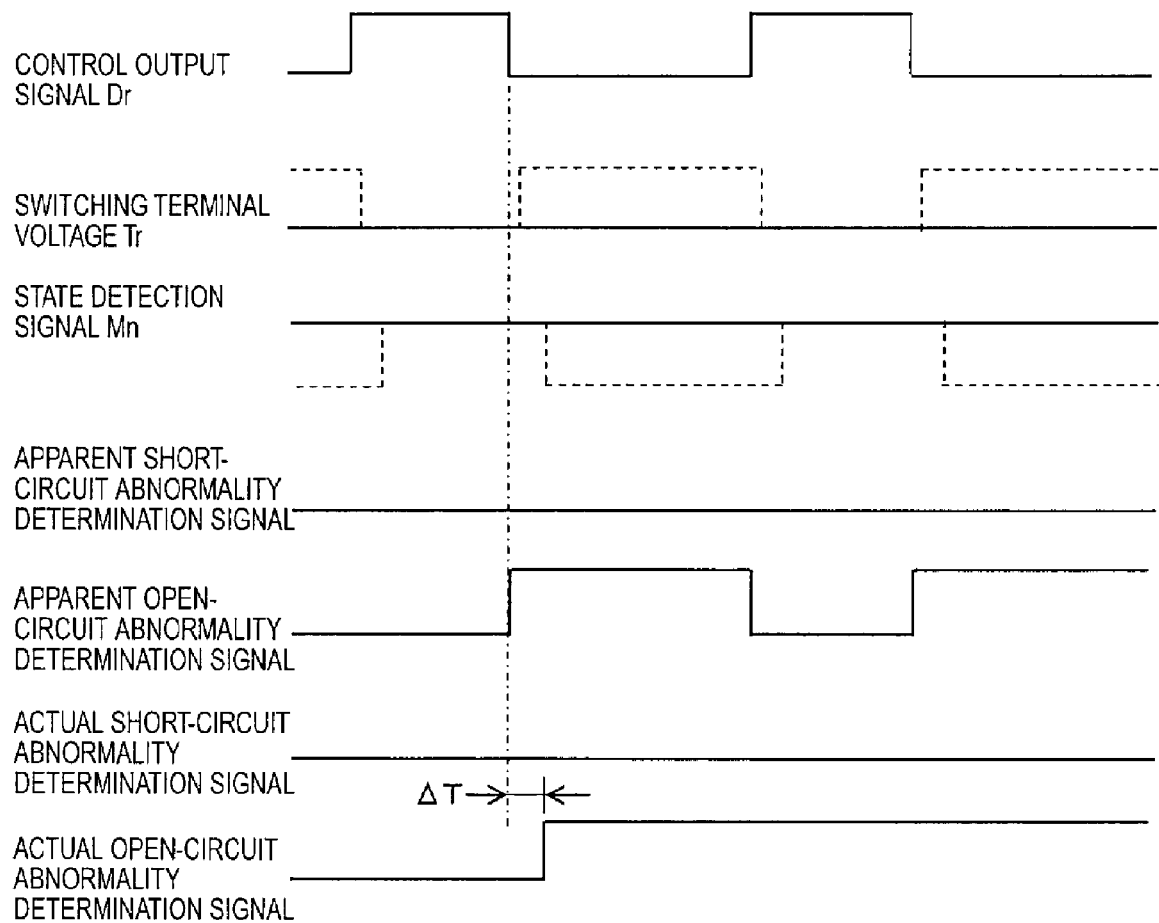
FIG. 4 is a timing chart illustrating an operation characteristic of the abnormality detection apparatus for a power feed circuit at the time of open-circuit abnormality according to the first embodiment of the present invention.

In FIG. 4, similar to FIGS. 2 and 3, as logic waveforms in the open-circuit abnormality state of the electric load 103, there are illustrated the control output signal Dr, the switching terminal voltage Tr, the state detection signal Mn, the apparent short-circuit abnormality determination signal, the apparent open-circuit abnormality determination signal, the actual short-circuit abnormality determination signal, and the actual open-circuit abnormality determination signal.

Hereinafter, description will be given while focusing on the difference of the operation in FIG. 4 from the normal operation in FIG. 2.

In FIG. 4, the switching terminal voltage Tr is maintained at the "L" logic level, and the state detection signal Mn is maintained at the "H" logic level, and the actual open-circuit abnormality determination signal rises after the lapse of the determination waiting time $\Delta T$ from the rising of the apparent open-circuit abnormality determination signal.

When an open-circuit accident occurs in the interior of the electric load 103 or there takes place an open-circuit accident such as an open-circuit failure of the wiring circuits 104b, 104c, a contact failure of a connector (not shown), etc., resulting in a state that the load resistance RL indicates infinity, the state detection transistor 151 always becomes in an open state, so the state detection signal Mn will always maintain the "H" logic level under the action of the pull-up resistor 154. As a consequence, when the control output signal Dr is in the "L" logic level, the state detection transistor 151, which should be originally closed, is put into an open state, and hence the state detection signal Mn continues to be at the "H" logic level, so the presence or absence of a short-circuit abnormality is determined.

Here, note that when a short-circuit abnormality occurs in the interior of the power transistor 130, too, the state detection signal Mn does not become the "L" logic level in spite of the control output signal Dr being at the "L" logic level, so it is apparently determined that the electric load 103 is in an open-circuit abnormality. Also, when there takes place a ground fault accident in which the wiring circuit 104c at a negative side of the power transistor 130 is grounded to the vehicle body, the state detection signal Mn does not become the "L" logic level in spite of the control output signal Dr being at the "L" logic level, so it is apparently determined that the electric load 103 is in an open-circuit abnormality.

In FIG. 4, in the open period of the power transistor 130, the switching terminal voltage Tr, which should originally be at the level of the power supply voltage Vb, actually becomes a zero state. Also, if the control output signal Dr is at the "L" logic level with the state detection signal Mn continuing to be at the "H" logic level, the state detection signal Mn, which should originally become the "L" logic level after the lapse of a response time, continues to be at the "H" logic level. Further, in FIG. 4, since the state detection signal Mn continues to be at the "H" logic level, the presence or absence of the open-circuit abnormality is determined after the lapse of the determination waiting time $\Delta T$ in spite of the control output signal Dr being at the "L" logic level, so the actual open-circuit abnormality determination signal becomes the "H" logic level.

Now, reference will be made to an abnormality determination operation according to the first embodiment of the present invention as illustrated in FIG. 1 while referring to a flow chart in FIG. 5.

Figure 5:
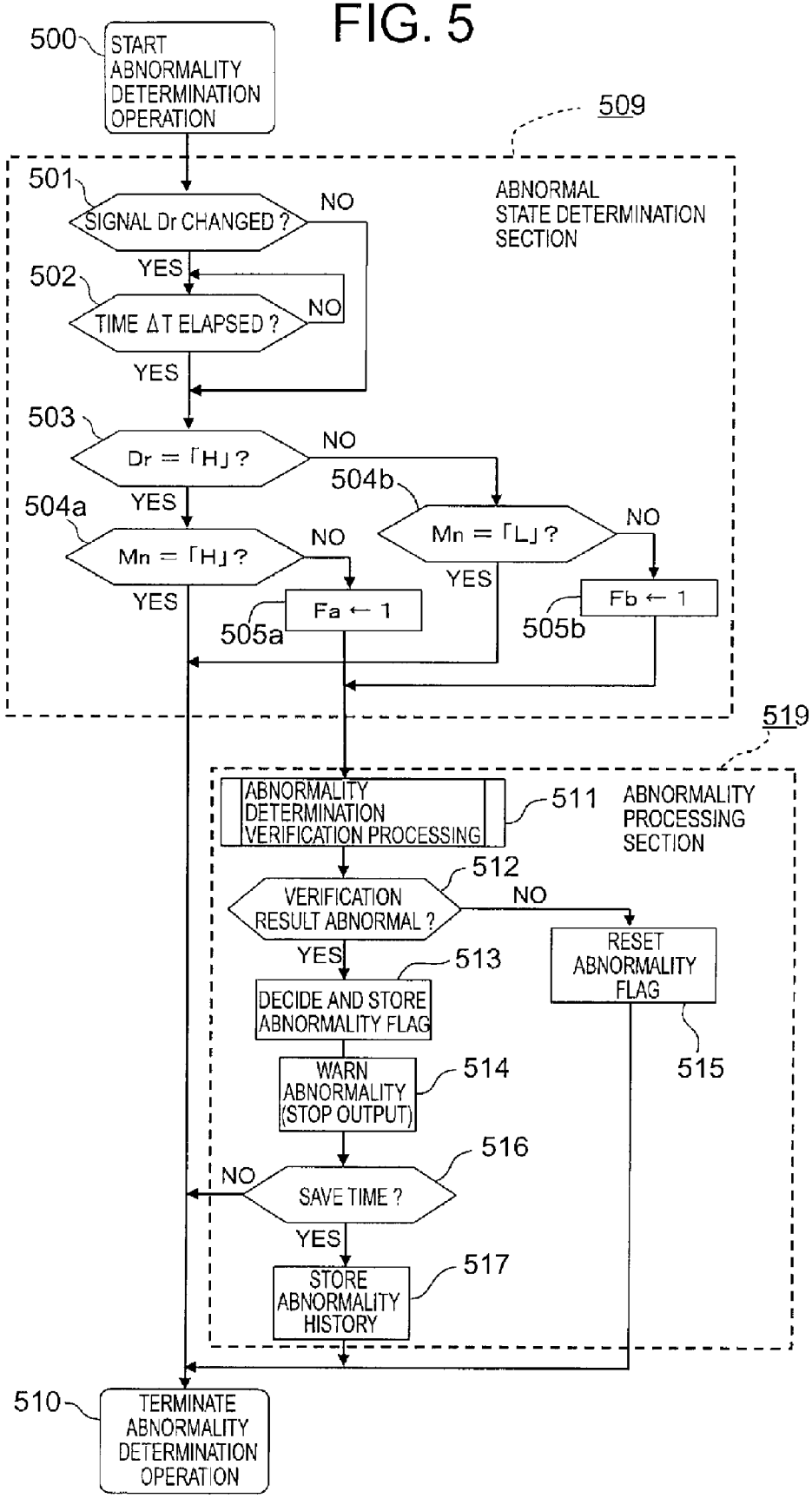
FIG. 5 is a flow chart illustrating an abnormality determination operation of the abnormality detection apparatus for a power feed circuit according to the first embodiment of the present invention.

FIG. 5 illustrates the processing operations of the state determination program 112b and the abnormality processing program 112c in the program memory 112A (see FIG. 1). Here, note that the switching control section (microprocessor) 110A sets the logic level of the control output signal Dr to the "H" or "L" level based on the power feed control program 112a, and executes power feed processing or the power feed stop processing to the electric load 103.

In FIG. 5, a processing block 509 (see a broken line frame) comprising steps 501 through 503, 504a, 504b, 505a and 505b corresponds to the abnormal state determination section (state determination program 112b) that constitutes a logical determination section. Also, a processing block 519 (see a broken line frame) comprising steps 511 through 517 corresponds to the abnormality processing section (abnormality processing program 112c), and in the abnormal state determination section 509, step 502 corresponds to a determination waiting section. In addition, in the abnormality processing section 519, step 511 corresponds to a determination verification section for reexecuting abnormality determination verification processing, step 514 corresponds to an abnormality warning section, and step 517 corresponds to a save and storage section for storing historical information of an abnormality occurrence state.

First of all, in the abnormal state determination section 509, an abnormality determination operation is started (step 500), and it is determined whether the logic level of the control output signal Dr changes between the last abnormality determination operation and the current abnormality determination operation (step 501).

When it is determined in step 501 that there is no change in the logic level of the control output signal Dr (that is, NO), the control flow proceeds to step 503 (to be described later), whereas when it is determined in step 501 that the logic level of the control output signal Dr changes (that is, YES), it is subsequently determined whether the predetermined determination waiting time $\Delta T$ has elapsed (step 502).

When it is determined in step 502 that the predetermined determination waiting time $\Delta T$ has not yet elapsed (that is, NO), the determination processing in step 502 is repeatedly executed, whereas when it is determined that the predetermined determination waiting time $\Delta T$ has elapsed (that is, YES), the control flow proceeds to the following determination processing (step 503).

In step 502 (the determination waiting section), in order to shift to the following determination processing (step 503) after the determination waiting time $\Delta T$ (see FIGS. 3 and 4) has been waited or elapsed, the step 502 is repeatedly executed until the determination waiting time $\Delta T$ has elapsed after the start of execution of the step 502.

Then, by referring to the power feed control program 112a, it is determined whether the current control output signal Dr is at the "H" logic level (or the "L" logic level) (step 503). When it is determined in step 503 that the control output signal Dr is at the "H" logic level (that is, YES), it is subsequently determined whether the state detection signal Mn is at the "H" logic level (or the "L" logic level) (step 504a).

When it is determined in step 504a that the state detection signal Mn is at the "H" logic level (that is, YES), the control flow immediately shifts to the termination processing of the abnormality determination operation of FIG. 5 (step 510), whereas when it is determined in step 504a that the state detection signal Mn is at the "L" logic level (that is, NO), a short-circuit abnormality flag Fa (short-circuit abnormality determination signal) is set to "1" (step 505a), and the control flow shifts to processing (step 511) in the abnormality processing section 519.

On the other hand, when it is determined in step 503 that the control output signal Dr is at the "L" logic level (that is, NO), it is subsequently determined whether the state detection signal Mn is at the "L" logic level (or the "H" logic level) (step 504b). When it is determined in step 504b that the state detection signal Mn is at the "L" logic level (that is, YES), the control flow immediately shifts to the termination processing of the abnormality determination operation of FIG. 5 (step 510), whereas when it is determined in step 504b that the state detection signal Mn is at the "H" logic level (that is, NO), an open-circuit abnormality flag Fb (open-circuit abnormality determination signal) is set to "1" (step 505b), and the control flow shifts to processing (step 511) in the abnormality processing section 519.

In the abnormality processing section 519, first of all, abnormality determination verification processing similar to that of the abnormal state determination section 509 is executed again in response to the abnormality determination signal (the short-circuit abnormality flag Fa or the open-circuit abnormality flag Fb) from the abnormal state determination section 509 (step 511). The abnormality determination verification processing (step 511) according to the determination verification section corresponds to the processing (step 501 through 505b) according to the abnormal state determination section 509.

Subsequently, it is determined whether the result of the verification according to the abnormality determination verification processing (step 511) indicates abnormality again (step 512), and when it is determined that the verification result indicates an abnormal state (that is, YES), the abnormal state is finally decided and stored in the abnormality flag (the short-circuit abnormality flag Fa or the open-circuit abnormality flag Fb) (step 513). Also, an abnormality notification command is output so as to operate the warning indicator 105, and at the same time the control output signal Dr is fixed to the "L" logic level for stopping an output as necessary, whereby the power feed output to the electric load 103 is stopped (step 514). On the other hand, when it is determined in step 512 that the verification result indicates a normal state (that is, NO), the abnormality flag (the short-circuit abnormality flag Fa or the open-circuit abnormality flag Fb) set in step 505a or 505b in the abnormal state determination section 509 is reset (step 515), and the control flow shifts to the termination processing (step 510).

Thereafter, subsequent to the step 514, it is determined whether it is time to transfer and store (save) historical information of the abnormality occurrence state (step 516), and when determined that it is not time to save the historical information (that is, NO), the control flow immediately shifts to the termination processing (step 510), whereas when determined in step 516 that it is time to save the historical information (that is, YES), the abnormality occurrence state decided and stored in step 513 is transferred and stored into the data memory 113 (step 517), and the control flow shifts to the termination processing (step 510).

Though the switching control section (microprocessor) 110A shifts, following the termination processing (step 510), to the start processing of the abnormality determination operation (step 500) again after the lapse of the predetermined waiting period, other control operations are executed in this waiting period. However, after the abnormality occurrence state is finally decided and stored in step 513, the control flow does not shift to the start processing of the abnormality determination operation (step 500) following the termination processing (step 510).

In addition, in the abnormality processing section 519, the determination processing of the save time (step 516) is set, for example, in such a manner that a positive determination "YES" is made immediately before the operation of the abnormality detection apparatus 100A is stopped. In this case, electric power continues to be fed to the abnormality detection apparatus 100A for a moment (a certain period of time) after the power switch 102 has been interrupted or turned off, during which the abnormality detection apparatus 100A executes the transfer and save processing (step 517).

As described above, the abnormality detection apparatus 100A for a power feed circuit according to the first embodiment of the present invention is constructed such that the DC power supply 101, the electric load 103 and the power transistor 130, which is controlled to be switched on and off by the switching control section 110A, are connected in series with one another through the wiring circuits 104b, 104c, with the constant current control circuit 140a, the overheat interruption circuit 140b and the state detection circuit 150 being connected to the power transistor 130 for cooperation therewith. The switching control section 110A is provided with the abnormal state determination section 509 (the state determination program 112b and the abnormality processing section 519 (the abnormality processing program 112c).

The constant current control circuit 140a includes the conduction control transistor 142 that operates in response to the detected voltage of the current detection resistor 131. In addition, the constant current control circuit 140a constitutes the negative feedback control circuit, and linearly controls the conductive state of the power transistor 130 in such a manner that the current flowing through the power transistor 130 does not become a value equal to or larger than the value of the limit threshold current Ic which is larger than the predetermined reference current Ir corresponding to the rated current of the power transistor 130. Further, the constant current control circuit 140a serves to maintain, upon occurrence of a short-circuit abnormality or malfunction of the electric load 103, the voltage across the opposite ends of the power transistor 130 at a value equal to or higher than the predetermined logical determination voltage.

The overheat interruption circuit 140b constitutes the comparison control circuit, and includes the temperature detection element 145 for detecting the temperature in the vicinity of the power transistor 130, and the interruption control transistor 143. The overheat interruption circuit 140b operates to interrupt or turn off the power transistor 130 when the temperature in the vicinity of the power transistor 130 exceeds the predetermined temperature.

The state detection circuit 150 includes the state detection transistor 151 that is operated to open and close in accordance with the level of the voltage across the opposite ends of the power transistor 130, and the drive resistors (open-circuit detection resistors) 152, 153 connected in parallel to the power transistor 130. The output signal of the state detection transistor 151 is input to the switching control section 110A as the state detection signal Mn. The abnormal state determination section 509 (state determination program 112b) constitutes the logical determination section, and makes a determination that a short-circuit abnormality has occurred in the electric load 103, when the control output signal Dr is a close command ("H" logic level) for the power transistor 130, and when the voltage across the opposite ends of the power transistor 130 detected by the state detection circuit 150 continues to be equal to or larger than the logical determination voltage. Also, the abnormal state determination section 509 makes a determination that an open-circuit abnormality has occurred in the electric load 103, when the control output signal Dr is an open command ("L" logic level) for the power transistor 130, and when the voltage across the opposite ends of the power transistor 130 detected by the state detection circuit 150 continues to be less than the logical determination voltage.

The abnormality processing section 519(abnormality processing program 112c) executes at least one of the abnormality warning processing and the stop processing of the control output signal Dr based on the result of the determination of the abnormal state determination section 509 (the short-circuit abnormality flag Fa or the open-circuit abnormality flag Fb).

The power transistor 130 and the conduction control transistor 142 are each composed of an N-channel type field-effect transistor, and the power transistor 130 is constructed in such a manner that when the control output signal Dr indicates the "H" logic level, a gate-source voltage equal to or higher than the turn-on or gate-on voltage Von is impressed to the power transistor 130 so as to close a circuit or path between the drain and the source thereof. The constant current control circuit 140a and the overheat interruption circuit 140b are operated by the voltage of the control output signal Dr which serves as a power supply. The current detection resistor 131 is connected in series to the current mirror circuit through which a fine current proportional to the drain current of the power transistor 130 flows, so that it generates the first detected voltage V1 when the reference current Ir flows into the power transistor 130, but generates the second detected voltage V2 when the limit threshold current Ic flows into the power transistor 130. The first detected voltage V1 is set to a value equal to or lower than the gate-off voltage Voff of the conduction control transistor 142, and the second detected voltage V2 is set to a value equal to or higher than the gate-on voltage Von of the conduction control transistor 142. The detected voltage of the current detection resistor 131 is impressed to the gate terminal of the conduction control transistor 142.

In addition, the drain terminal of the conduction control transistor 142 is connected to the junction of the first and second drive resistors 141a, 141b that are connected in series with each other, and inserted between the gate terminal of the power transistor 130 and the control output terminal of the switching control section 110A, and the source terminal of the conduction control transistor 142 is connected to the negative terminal of the DC power supply 101, together with the source terminal of the power transistor 130. Accordingly, the power loss due to the current detection resistor 131 is greatly reduced, thereby suppressing the generation of heat, and it is possible to linearly control the current supplied to the power transistor 130 by using a relatively simple circuit.

Moreover, since the constant current control circuit 140a and the overheat interruption circuit 140b are operated by the voltage of the control output signal Dr (close command) of the "H" logic level which serves as a power supply, it is possible to simplify the circuit configuration without the need of any special power supply.

The state detection transistor 151 inputs a logically inverted signal responsive to the voltage across the opposite ends of the power transistor 130 to the switching control section 110A as the state detection signal Mn. The drive resistors 152, 153 of the state detection transistor 151 function as open-circuit detection resistors. Also, the output terminal of the state detection transistor 151 is connected to the output terminal of the constant voltage power supply circuit 120 through the pull-up resistor 154, and the constant voltage power supply circuit 120 impresses the control power supply voltage Vcc to the switching control section 110A. As a result, the state detection circuit 150 is operated by the open (turn-off) voltage across the opposite ends of the power transistor 130 and the control power supply voltage Vcc, so no special control power supply is needed, and the circuit configuration can be simplified.

The switching control section 110A is constituted by the microprocessor including the program memory 112A, and the program memory 112A includes the power feed control program 112a (power feed control section) that generates the control output signal Dr for controlling to open and close the power transistor 130, the state determination program 112b (abnormal state determination section 509), and the abnormality processing program 112c (abnormality processing section 519). The abnormal state determination section 509 (see FIG. 5) periodically monitors the correlation between the logic state of the control output signal Dr and the logic state of the state detection signal Mn, and generates the short-circuit abnormality flag Fa or the open-circuit abnormality flag Fb as the abnormality determination signal when an abnormal state is detected in the correlation between these logic states. The abnormality processing section 519 includes the determination verification section 511, executes abnormality determination verification processing again in response to the abnormality determination signal from the abnormal state determination section 509, and executes at least one of the abnormality warning processing and the stop processing of the control output signal Dr in accordance with the verification result.

Thus, by providing the switching control section (microprocessor) 110A having the power feed control program 112a with an abnormality determination function, it is possible to simplify the hardware configuration thereby to achieve an abnormality detection function at low cost. Further, an incorrect determination due to noise superposed on the state detection signal Mn is prevented by the determination verification section so that the smoothing time constant of the smoothing capacitor 155 (noise filter) can be reduced. As a consequence, it is possible to execute abnormality determination processing in a quick manner at the time of normal operation.

Furthermore, the abnormal state determination section 509 includes the determination waiting section 502, and serves to nullify the abnormality determination operation in a transition period corresponding to the response time of the state detection circuit 150 (including the operation response delay time of the power transistor 130) immediately after the logic of the control output signal Dr has been inverted, whereby an abnormality determination can be excluded which would otherwise be generated in a transition period at the time of open/close switching of the switching control section bOA. As a result, it is possible to prevent an incorrect abnormality determination.

In addition, the abnormality processing section 519 is provided with the save and storage section 517 that transfers the historical information of the abnormality occurrence state to the data memory 113. Accordingly, abnormality processing can be carried out by using a microprocessor that performs power feed control with an inexpensive arrangement, and maintenance and inspection can be simplified by using the historical information.

Further, the power transistor 130 is composed of an N-channel type field-effect transistor, and constitutes the power module 180A integrated with the power transistor 130, the constant current control circuit 140a and the overheat interruption circuit 140b, so the power feed circuit for the electric load 103, including an overcurrent protection function and an overheat protection function, can be constructed in a small size and at a low price.

Embodiment 2

Figure 6:
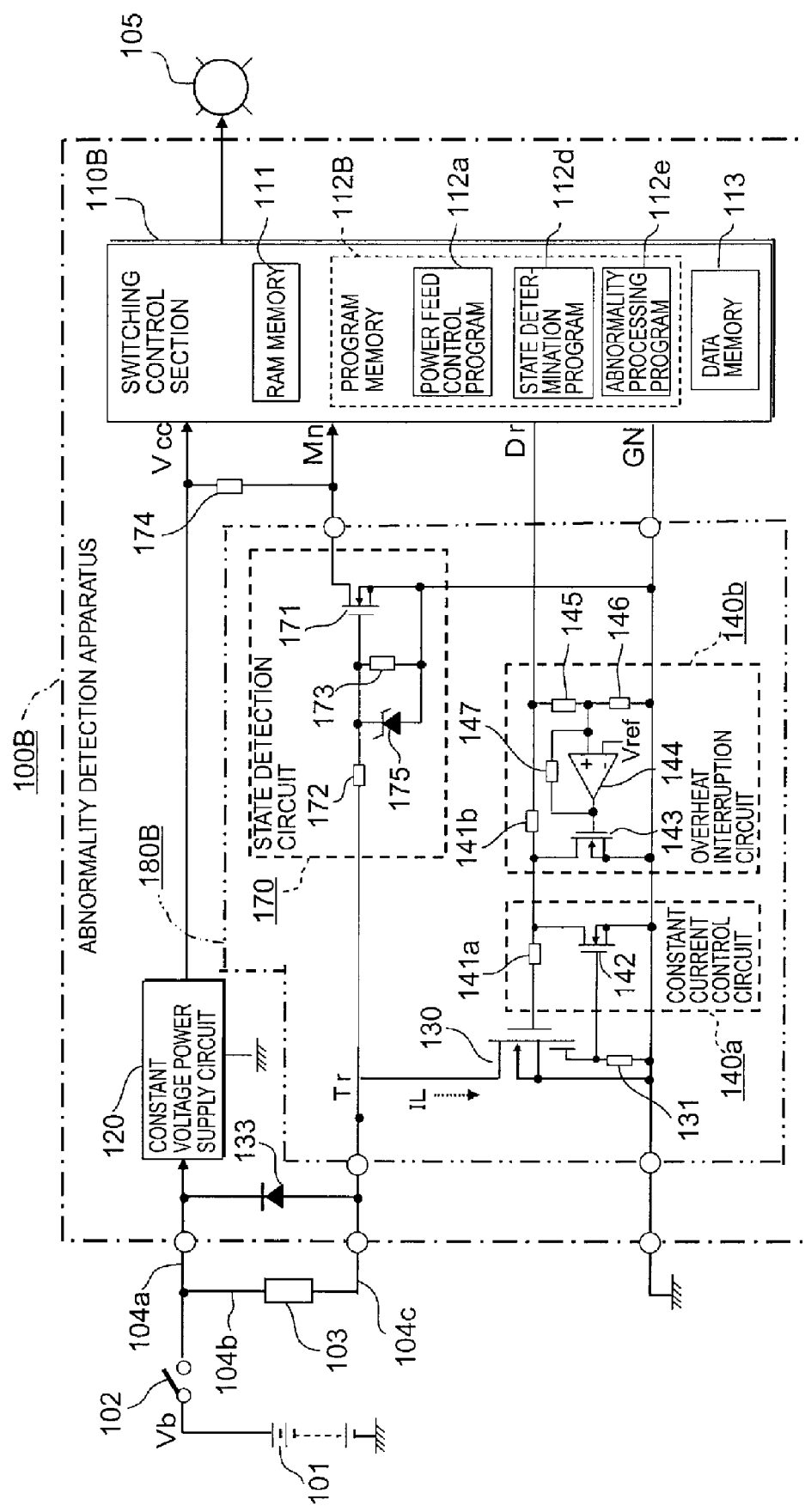
FIG. 6 is a circuit block diagram showing the overall configuration of an abnormality detection apparatus for a power feed circuit according to a second embodiment of the present invention.

Although in the above-mentioned first embodiment (FIG. 1), the state detection circuit 150 is constructed separately from the power module 180A, a state detection circuit 170 may be built in a power module 180B, as shown in FIG. 6.

Hereinafter, reference will be made to an abnormality detection apparatus for a power feed circuit according to a second embodiment of the present invention while referring to FIG. 6.

FIG. 6 is a block diagram that illustrates the overall configuration of the abnormality detection apparatus for a power feed circuit according to the second embodiment of the present invention, wherein the same parts or components as those described above (see FIG. 1) are identified by the same symbols or by the same symbols with "B" affixed to their ends, while omitting a detailed explanation thereof.

In FIG. 6, the abnormality detection apparatus, generally designated at 100B, specifically constitutes a control unit of an automotive transmission, for example, and connected from outside to the abnormality detection apparatus 100B are a DC power supply 101, a power switch 102, an electric load 103, and a warning indicator 105 and so on. In addition, the electric load 103 is composed, for example, of an electromagnetic coil of an electromagnetic valve for driving the automotive transmission.

A switching control section 110B, which constitutes a major part of the abnormality detection apparatus 100B, comprises a microprocessor (CPU) that includes a RAM memory 111 for calculation processing, a program memory 112B, and a data memory 113. In this case, a state determination program 112d and an abnormality processing program 112e in the program memory 112B are different from those of the above-mentioned first embodiment in a part of the content of processing, as will be described later.

A constant voltage power supply circuit 120 and the power module 180B including a power transistor 130, a current detection resistor 131, a constant current control circuit 140a and an overheat interruption circuit 140b, in addition to the switching control section 110B, are built in the abnormality detection apparatus 100B, and a commutating diode 133 connected in parallel to the electric load 103 is further added, whereby a load current IL flowing through the power transistor 130 during closure thereof commutates and attenuates rapidly through the commutating diode 133 when the power transistor 130 is opened. Accordingly, no surge voltage is generated upon opening or turning-off of the power transistor 130 though the interruption or turn-off response of the electric load 103 deteriorates, so the overvoltage suppression diode 132 and the smoothing capacitor 155 as referred to above (see FIG. 1) can be made unnecessary. Here, note that the smoothing capacitor 155 may not be removed but a small capacity one may be used.

Also, the state detection circuit 170 employing a state detection transistor 171 in the form of an N-channel type field-effect transistor is built in the abnormality detection apparatus 100B in place of the above-mentioned state detection circuit 150 using a bipolar transistor (FIG. 1). The state detection circuit 170 is arranged in the power module 180B, and includes a drive resistor 172, a voltage dividing resistor 173 and a voltage limiting diode 175 in addition to the state detection transistor 171. In the state detection circuit 170, the drive resistor 172 and the voltage dividing resistor 173 are connected in series with each other, and inserted between the drain and source terminals of the power transistor 130. A junction between the drive resistor 172 and the voltage dividing resistor 173 is connected to a gate terminal of the state detection transistor 171, and the voltage limiting diode 175 is connected in parallel to the voltage dividing resistor 173. The state detection transistor 171 has a source terminal grounded to the vehicle body, and a drain terminal connected to an input terminal of the switching control section 110B, to which the state detection signal Mn is input and at the same time connected to an output terminal of the constant voltage power supply circuit 120 through a pull-up resistor 174.

When the power transistor 130 is opened or turned off in the normal state of the electric load 103, a gate voltage is impressed to the state detection transistor 171 through a series circuit comprising the electric load 103 and the drive resistor 172, whereby the state detection transistor 171 is closed or turned on, thereby bringing the state detection signal Mn input to the switching control section 110B into an "L" logic level. Here, note that the resistance value Rd of the drive resistor 172 is set so as to be sufficiently large in comparison with the load resistance RL of the electric load 103 (Rd >>RL). In addition, by connecting the pull-up resistor 174 to the drain terminal of the state detection transistor 171, the voltage on the gate terminal of the state detection transistor 171 becomes zero in an open-circuit or disconnected state of the electric load 103, and hence the state detection transistor 171 is opened or turned off, whereby the logic level of the state detection signal Mn is always put into an "H" level. The abnormality detection apparatus 100B as constructed above operates substantially in a similar manner as stated above (see FIG. 2 through FIG. 5).

In FIG. 6, the power module 180B is constructed such that the power transistor 130, the current detection resistor 131, the constant current control circuit 140a, the overheat interruption circuit 140b and the state detection circuit 170 are integrally formed with one another, but in order to reduce the number of terminals of the power module 180B, the pull-up resistor 174 is connected from outside to the state detection circuit 170 (the power module 180B).

Here, note that in case where the electric load 103 is composed, for example, of a four-phase stepping motor, a power transistor is used for each of four field coils in the four-phase stepping motor, so it may be constructed such that the single four-phase stepping motor is controlled by using two power modules (not shown). In this case, two power transistors and their related circuits are received in the one power module.

Now, reference will be made to the operation of the abnormality detection apparatus for a power feed circuit according to the second embodiment of the present invention while referring to a flow chart in FIG. 7.

FIG. 7 illustrates the processing operations of the state determination program 112d and the abnormality processing program 112e in the program memory 112B. In FIG. 7, an abnormal state determination section 709 and an abnormality processing section 719 correspond to the above-mentioned abnormal state determination section 509 and the above-mentioned abnormality processing section 519 (see FIG. 5). Steps 700 through 703, 704a, 704b, 710, 716 and 717 in FIG. 7 are processes similar to those in the above-mentioned steps 500 through 503, 504a, 504b, 510, 516 and 517. Also, steps 714a, 714b in FIG. 7 are processes similar to those in the above-mentioned step 514. Accordingly, the step 702 corresponds to the determination waiting section, the steps 714a, 714b correspond to the abnormality warning section, and the step 717 corresponds to the save and storage section. Further, steps 705a, 705b in the abnormal state determination section 709 together constitute a counting section for counting the number or frequency of abnormality detections, and steps 713a, 713b in the abnormality processing section 719 together constitute an abnormality decision and storage section. In this case, the counting section (steps 705a, 705b) includes a short-circuit abnormality counter CNa for up counting the number of occurrences of the short-circuit abnormality, and an open-circuit abnormality counter CNb for up counting the number of occurrences of the open-circuit abnormality. In addition, the switching control section (microprocessor) 110B sets the logic level of the control output signal Dr to the "H" or "L" level based on the power feed control program 112a, and executes power feed processing or the power feed stop processing to the electric load 103, similarly as stated above.

First of all, the switching control section 110B starts an abnormality determination operation (step 700), and determines whether the logic level of the control output signal Dr changes between the last abnormality determination operation and the current abnormality determination operation (step 701).

When it is determined in step 701 that the logic level of the control output signal Dr changes (that is, YES), the control flow shifts to step 702, whereas when it is determined that the logic level does not change (that is, NO), the control flow shifts to step 703. In step 702, waiting processing for a determination waiting time AT (see FIG. 3 and FIG. 4) is carried out (step 702), and the control flow shifts to step 703 after the lapse of the determination waiting time ΔT.

Then, in step 703, by referring to the power feed control program 112a, it is determined whether the current control output signal Dr is at the "H" logic level (or the "L" logic level), and when it is determined that the control output signal Dr is at the "H" logic level (that is, YES), the control flow shifts to step 704a, whereas when it is determined that the control output signal Dr is at the "L" logic level (that is, NO), the control flow shifts to step 704b.

In step 704a, it is determined whether the state detection signal Mn is at the "H" logic level (or the "L" logic level), and when it is determined that the state detection signal Mn is at the "H" logic level (that is, YES), the count value of the short-circuit abnormality counter CNa for counting the number of occurrences of the short-circuit abnormality is reset to zero (step 706a), and the control flow shifts to the termination processing (step 710).

On the other hand, when it is determined in step 704a that the state detection signal Mn is at the "L" logic level (that is, NO), the count value of the short-circuit abnormality counter CNa is added by "1" (i.e., the counter value is incremented) (step 705a), and it is subsequently determined whether the count value of the short-circuit abnormality counter CNa has been counted up to a predetermined value (threshold frequency) α (step 707a).

When determined as CNa<α in step 707a (that is, NO), the control flow shifts to the termination processing (step 710), whereas when determined as CNa=α (that is, YES), the control flow shifts to step 713a (to be described later) in the abnormality processing section 719.

On the other hand, in step 704b branched from the result of the determination "NO" in step 703, it is determined whether the state detection signal Mn is at the "L" logic level (the "H" logic level), and when it is determined that the state detection signal Mn is at the "L" logic level (that is, YES), the count value of the open-circuit abnormality counter CNb for counting the number of occurrences of the open-circuit abnormality is reset to zero (step 706b), and the control flow shifts to the termination processing (step 710), whereas when it is determined in step 704b that the state detection signal Mn is at the "H" logic level (that is, NO), the counter value of the open-circuit abnormality counter CNb is added by "1" (i.e., the counter value is incremented) (step 705b), and it is subsequently determined whether the count value of the open-circuit abnormality counter CNb has been counted up to a predetermined value (threshold frequency) β (step 707b).

When determined as CNb<β in step 707b (that is, NO), the control flow shifts to the termination processing (step 710), whereas when determined as CNb=β (that is, YES), the control flow shifts to step 713b (to be described later) in the abnormality processing section 719. Here, note that the threshold frequencies α, β in the form of comparison references in steps 707a, 707b, respectively, are set in accordance with the abnormality detection accuracy as required of the power feed circuit, but may be set as α=β.

In step 713a (abnormality decision and storage section) in the abnormality processing section 719, the short-circuit abnormality flag FA is set to "1" in response to a count-up signal of the short-circuit abnormality counter CNa from step 707a, and the short-circuit abnormality state is finally decided and stored. Similarly, in step 713b (abnormality decision and storage section) in the abnormality processing section 719, the open-circuit abnormality flag FB is set to "1" in response to a count-up signal of the open-circuit abnormality counter CNb from step 707b, and the open-circuit abnormality state is finally decided and stored.

In step 714a following the short-circuit abnormality decision and storage processing (step 713a), a short-circuit abnormality notification command is output so as to operate the warning indicator 105, and at the same time the control output signal Dr is fixed to the "L" logic level for stopping an output as necessary, whereby the power feed output to the electric load 103 is stopped. Similarly, in step 714b following the open-circuit abnormality decision and storage processing (step 713b), a open-circuit abnormality notification command is output so as to operate the warning indicator 105, and at the same time the control output signal Dr is fixed to the "L" logic level for stopping an output as necessary, whereby the power feed output to the electric load 103 is stopped.

Finally, it is determined whether it is time to save the historical information of the abnormality occurrence state (step 716), and when determined that it is not time to save the historical information (that is, NO), the control flow shifts to the termination processing (step 710), whereas when determined that it is time to save the historical information (that is, YES), the save processing of the historical information (step 717) is executed, and the control flow shifts to the termination processing (step 710). In step 717, the historical information of the abnormality occurrence state finally decided and stored in steps 713a, 713b is transferred and stored into the data memory 113.

Similarly as stated above, the switching control section (microprocessor) 110B shifts, following the termination processing (step 710), to the start processing of the abnormality determination operation (step 700) again after the lapse of a predetermined waiting period, and other control operations are executed in this waiting period. However, after the final decision and storage of the abnormal state in steps 713a, 713b, the control flow does not shift to step 700.

In addition, the determination processing of the save time (step 716) is set, for example, in such a manner that a positive determination "YES" is made immediately before the operation of the abnormality detection apparatus 100B is stopped, and electric power continues to be fed to the abnormality detection apparatus 100B for a moment after the power switch 102 has been interrupted or turned off, during which the abnormality detection apparatus 100B executes the transfer and save processing (step 717).

Although the counters CNa, CNb used in steps 705a, 705b have been described as the up counters, respectively, they can be down counters. In the case of using the down counters, predetermined threshold frequencies are set as initial values for the respective counters, so that each down counter is decremented each time an abnormal state is detected, and an abnormality determination signal (count-up signal) is generated when the count value of each counter reaches zero. That is, in the case of the up counters, the count value of each counter is initialized to "0" when power is turned on, whereas in the case of the down counters, the count values of the counters are initialized to predetermined threshold frequencies, respectively, upon turning on of power.

As described above, the abnormality detection apparatus 100B for a power feed circuit according to the second embodiment of the present invention is constructed such that the DC power supply 101, the electric load 103 and the power transistor 130, which is controlled to be switched on and off by the switching control section 110B, are connected in series with one another through the wiring circuits 104b, 104c, with the constant current control circuit 140a, the overheat interruption circuit 140b and the state detection circuit 750 being connected to the power transistor 130 for cooperation therewith. The switching control section 110B is provided with the abnormal state determination section 709 (state determination program 112d) and the abnormality processing section 719 (abnormality processing program 112e).

The state detection circuit 170 includes the state detection transistor 171 that is operated to open and close in accordance with the level of the voltage across the opposite ends of the power transistor 130, and the drive resistor 172 connected in parallel to the power transistor 130. The output signal of the state detection transistor 171 is input to the switching control section 110B as the state detection signal Mn. The state detection transistor 171 generates a logical inversion signal (state detection signal Mn) in response to the voltage across the opposite ends of the power transistor 130, and the drive resistor 172 of the state detection transistor 171 functions as an open-circuit detection resistor. Also, the output terminal of the state detection transistor 171 is connected to the output terminal of the constant voltage power supply circuit 120 through the pull-up resistor 174, and the output terminal of the constant voltage power supply circuit 120 impresses the control power supply voltage Vcc to the switching control section 110B. As a result, the state detection circuit 170 is operated by the open (turn-off) voltage across the opposite ends of the power transistor 130 and the control power supply voltage Vcc, so no special control power supply is needed, and the circuit configuration can be simplified.

The switching control section 110B is constituted by the microprocessor including the program memory 112B, and the program memory 112B includes the power feed control program 112a that generates the control output signal Dr for controlling to open and close the power transistor 130, the state determination program 112d that constitutes the abnormal state determination section 709, and the abnormality processing program 112e that constitutes the abnormality processing section 719.

The abnormal state determination section 709 periodically monitors the correlation between the logic state of the control output signal Dr and the logic state of the state detection signal Mn, so that the counter CNa or CNb is incremented by the counting section (step 705a or 705b) each time the correlation between these logic states indicates an abnormal state, and the count value of each counter is reset when the correlation indicates a normal state.

When the count values of the counting section 705a, 705b reach the predetermined threshold frequencies α, β, respectively, the abnormality processing section 719 sets the flags FA, FB through the abnormality decision and storage section (steps 713a, 713b), finally decides the abnormality determination result, and executes at least one of the abnormality warning processing or the stop processing of the control output signal Dr in accordance with the final result.

Thus, by providing the switching control section (microprocessor) 110B for controlling the power fed to the electric load 103 with an abnormality determination function, it is possible to simplify the hardware configuration thereby to achieve an abnormality detection function at low cost.

In addition, it is also possible to adjust a noise-induced misdetermination prevention level by arbitrarily changing the comparison set values of the counting section (counters CNa, CNb), i.e., abnormality decision levels (α, β).

Moreover, the interruption control transistor 143 in the overheat interruption circuit 140b and the state detection transistor 171 in the state detection circuit 170 are each composed of an N-channel type field-effect transistor, and the power transistor 130, the constant current control circuit 140a, the overheat interruption circuit 140b and the state detection circuit 170 are constituted by the integrated power module 180B. With such an arrangement, the power feed circuit (including the overcurrent protection function, the overheat protection function, and the state detection circuit 170) for the electric load 103 can be constructed in a small size and at a low cost.

Further, the power module 180B acquires a control power supply from the control output signal Dr during the closure or turning on of the power transistor 130, and also acquires a drive power supply for the state detection circuit 170 from the voltage across the opposite ends of the power transistor 130 during the opening or turning off of the power transistor 130, so a special control power supply terminal for the power module 180B can be made unnecessary.

While the invention has been described in terms of preferred embodiments, those skilled in the art will recognize that the invention can be practiced with modifications within the spirit and scope of the appended claims.

What is claimed is:

1. An abnormality detection apparatus for a power feed circuit in which a DC power supply, an electric load, and a power transistor, which is controlled to open and close by a switching control section, are connected in series with one another through a wiring circuit, wherein a constant current control circuit, an overheat interruption circuit and a state detection circuit are connected to said power transistor for cooperation therewith;

said switching control section includes an abnormal state determination section and an abnormality processing section;

said constant current control circuit comprises a negative feedback control circuit;

said constant current control circuit includes a conduction control transistor that operates in response to a detected voltage of a current detection resistor;

said constant current control circuit linearly controls the conductive state of said power transistor in such a manner that a current flowing through said power transistor does not become a value equal to or larger than the value of a limit threshold current which is larger than a predetermined reference current corresponding to a rated current of said power transistor, and maintains, upon occurrence of a short-circuit abnormality of said electric load, a voltage across opposite ends of said power transistor at a value equal to or higher than a predetermined logical determination voltage;

said overheat interruption circuit comprises a comparison control circuit;

said comparison control circuit includes a temperature detection element for detecting a temperature in the vicinity of said power transistor, and an interruption control transistor, and operates to interrupt said power transistor when the temperature in the vicinity of said power transistor exceeds a predetermined temperature;

said state detection circuit includes a state detection transistor and an open-circuit detection resistor connected in parallel to said power transistor;

said state detection transistor is operated to open and close in accordance with whether the voltage across the opposite ends of said power transistor becomes equal to or higher than said logical determination voltage;

an output signal of said state detection transistor is input to said switching control section as a state detection signal;

said abnormal state determination section comprises a logical determination section;

when a control output signal from said switching control section is a close command for said power transistor, and when the voltage across the opposite ends of said power transistor continues to be equal to or higher than said logical determination voltage, said logical determination section generates a short-circuit abnormality determination signal indicating that a short-circuit abnormality has occurred in said electric load;

when said control output signal is an open command for said power transistor, and when the voltage across the opposite ends of said power transistor continues to be lower than said logical determination voltage, said logical determination section generates an open-circuit abnormality determination signal indicating that an open-circuit abnormality has occurred in said electric load; and said abnormality processing section performs at least one of abnormality warning processing and stop processing of said control output signal in response to said short-circuit abnormality determination signal or said open-circuit abnormality determination signal.

2. The abnormality detection apparatus for a power feed circuit as set forth in claim 1, wherein said power transistor and said conduction control transistor each comprise an N-channel type field-effect transistor;

said power transistor is constructed in such a manner that when said control output signal indicates a high logic level, a gate-source voltage equal to or higher than a turn-on voltage of said power transistor is impressed to said power transistor so as to close a circuit between a drain and a source thereof;

said constant current control circuit and said overheat interruption circuit are operated by the voltage of said control output signal which serves as a power supply;

said current detection resistor is connected in series to a current mirror circuit through which a fine current proportional to a drain current of said power transistor flows, and said current detection resistor generates a first detected voltage set equal to or lower than a gate-off voltage of said conduction control transistor when said reference current flows through said power transistor, and generates a second detected voltage set equal to or higher than the gate-on voltage of said conduction control transistor when said limit threshold current flows through said power transistor;

the detected voltage of said current detection resistor is impressed to a gate terminal of said conduction control transistor;

said conduction control transistor has a drain terminal connected to a junction between a first drive resistor and a second drive resistor;

said first and second drive resistors are connected in series with each other, and inserted between a gate terminal of said power transistor and a control output terminal of said switching control section; and said conduction control transistor has a source terminal connected to a negative terminal of said DC power supply, and said power transistor has a source terminal connected to the negative terminal of said DC power supply.

3. The abnormality detection apparatus for a power feed circuit as set forth in claim 2, wherein said state detection transistor generates said state detection signal comprising a logical inversion signal in response to the voltage across the opposite ends of said power transistor;

said open-circuit detection resistor comprises the drive resistors of said state detection transistor;

said state detection transistor has an output terminal connected to an output terminal of a constant voltage power supply circuit through a pull-up resistor; and said constant voltage power supply circuit impresses a control power supply voltage to said switching control section.

4. The abnormality detection apparatus for a power feed circuit as set forth in claim 2, wherein said interruption control transistor comprises an N-channel type field-effect transistor; and said power transistor, said constant current control circuit and said overheat interruption circuit are constructed as an integrated power module.

5. The abnormality detection apparatus for a power feed circuit as set forth in claim 3, wherein said interruption control transistor and said state detection transistor each comprise an N-channel type field-effect transistor; and said power transistor, said constant current control circuit, said overheat interruption circuit and said state detection circuit are constructed as an integrated power module.

6. The abnormality detection apparatus for a power feed circuit as set forth in claim 1, wherein said switching control section comprises a microprocessor including a program memory;

said program memory includes:

a power feed control program that constitutes a power feed control section for generating said control output signal that controls to open and close said power transistor;

a state determination program that constitutes said abnormal state determination section; and an abnormality processing program that constitutes said abnormality processing section;

said abnormal state determination section periodically monitors a correlation between the logic state of said control output signal and the logic state of said state detection signal, and generates an abnormality determination signal comprising said short-circuit abnormality determination signal or said open-circuit abnormality determination signal when an abnormal state has been detected in said correlation; and said abnormality processing section includes a determination verification section for executing abnormality determination verification processing again in response to said abnormality determination signal, and executes at least one of said abnormality warning processing and said stop processing of said control output signal when the result of the verification of said determination verification section indicates an abnormality.

7. The abnormality detection apparatus for a power feed circuit as set forth in claim 6, wherein said abnormal state determination section includes a determination waiting section;

said determination waiting section nullifies an abnormality determination operation of said abnormal state determination section over a transition period immediately after the logic level of said control output signal has been inverted; and said transition period corresponds to a response time of said state detection circuit including an operation response delay time of said power transistor.

8. The abnormality detection apparatus for a power feed circuit as set forth in claim 6, wherein said program memory includes an external or internal nonvolatile data memory;

said abnormality processing section includes a save and storage section that stores historical information of an abnormality occurrence state; and said save and storage section transfers said historical information to said data memory.

9. The abnormality detection apparatus for a power feed circuit as set forth in claim 1, wherein said switching control section comprises a microprocessor including a program memory;

said program memory includes:

a power feed control program that constitutes a power feed control section for generating said control output signal that controls to open and close said power transistor;

a state determination program that constitutes said abnormal state determination section; and an abnormality processing program that constitutes said abnormality processing section;

said abnormal state determination section includes a counting section for counting the number of detections of an abnormal state, periodically monitors a correlation between the logic state of said control output signal and the logic state of said state detection signal, increases or decreases the count value of said counting section when an abnormal state is detected in said correlation, and initializes the count value of said counting section when said correlation is in a normal state;

said abnormality processing section includes an abnormality decision and storage section, sets said abnormality decision and storage section to finally decide an abnormality determination result when the count value of said counting section reaches a predetermined value, and executes at least one of said abnormality warning processing and said stop processing of said control output signal in accordance with said abnormality determination result.

10. The abnormality detection apparatus for a power feed circuit as set forth in claim 9, wherein said abnormal state determination section includes a determination waiting section;

said determination waiting section nullifies an abnormality determination operation of said abnormal state determination section over a transition period immediately after the logic level of said control output signal has been inverted; and said transition period corresponds to a response time of said state detection circuit including an operation response delay time of said power transistor.

11. The abnormality detection apparatus for a power feed circuit as set forth in claim 9, wherein said program memory includes an external or internal nonvolatile data memory;

said abnormality processing section includes a save and storage section that stores historical information of an abnormality occurrence state; and said save and storage section transfers said historical information to said data memory.

* * * * *